US008508262B2

(12) United States Patent
Schnaitter et al.

(10) Patent No.: US 8,508,262 B2
(45) Date of Patent: Aug. 13, 2013

(54) SIGNAL GENERATOR WITH OUTPUT FREQUENCY GREATER THAN THE OSCILLATOR FREQUENCY

(76) Inventors: William N. Schnaitter, San Ramon, CA (US); Guillermo J. Rozas, Los Gatos, CA (US)

( * ) Notice: Subject to any disclaimer, the term of this patent is extended or adjusted under 35 U.S.C. 154(b) by 0 days.

(21) Appl. No.: 13/227,166

(22) Filed: Sep. 7, 2011

(65) Prior Publication Data

US 2011/0316597 A1  Dec. 29, 2011

Related U.S. Application Data

(60) Division of application No. 12/703,022, filed on Feb. 9, 2010, now Pat. No. 8,035,430, which is a continuation of application No. 11/540,387, filed on Sep. 29, 2006, now Pat. No. 7,696,797, which is a continuation-in-part of application No. 11/096,770, filed on Mar. 31, 2005, now Pat. No. 7,227,397.

(51) Int. Cl.
H03B 19/00 (2006.01)
(52) U.S. Cl.
USPC .............. 327/116; 327/119; 327/175
(58) Field of Classification Search
USPC ............ 327/113, 116, 119–122, 171–172, 327/175–176; 331/10, 57, 143, DIG. 3
See application file for complete search history.

(56) References Cited

U.S. PATENT DOCUMENTS

| 4,088,960 A | 5/1978 | Osborne |
| 4,705,696 A | 11/1987 | Calabrese et al. |
| 4,705,969 A | 11/1987 | Gross |
| 5,051,614 A | 9/1991 | Ohta |
| 5,144,669 A | 9/1992 | Faulkner et al. |
| 5,180,994 A | 1/1993 | Martin et al. |
| 5,250,910 A | 10/1993 | Yabuki et al. |
| 5,402,019 A | 3/1995 | Drummond et al. |
| 5,559,457 A | 9/1996 | Uda et al. |
| 5,568,098 A | 10/1996 | Horie et al. |
| 5,864,246 A | 1/1999 | Anderson |
| 5,903,196 A | 5/1999 | Salvi et al. |
| 5,945,881 A | 8/1999 | Lakshmikumar |
| 6,005,443 A | 12/1999 | Damgaard et al. |
| 6,072,846 A | 6/2000 | Kyung et al. |
| 6,177,832 B1 | 1/2001 | Durec et al. |
| 6,198,317 B1 | 3/2001 | Chow et al. |
| 6,295,328 B1 | 9/2001 | Kim et al. |
| 6,333,896 B1 | 12/2001 | Lee |
| 6,441,668 B1 | 8/2002 | Miller |
| 6,456,128 B1 | 9/2002 | Nakamura |
| 6,480,046 B1 | 11/2002 | Camp, Jr. |
| 6,608,514 B1 | 8/2003 | Akita et al. |
| 6,711,360 B1 | 3/2004 | Wu |
| 6,798,299 B1 | 9/2004 | Mar et al. |
| 6,879,189 B2 | 4/2005 | Tallant, II |
| 6,882,229 B1 | 4/2005 | Ho et al. |

(Continued)

*Primary Examiner* — An Luu

(57) ABSTRACT

Systems and methods for design and operation of signal generator circuitry with output frequencies greater than the oscillator frequency. Accordingly, in a first method embodiment, a method of producing an output periodic electronic signal comprises accessing four signals having a quadrature phase relationship. First and second pairs of these signals having a one half cycle phase relationship are averaged to produce two signals having an improved duty cycle and a one-quarter cycle phase relationship. The first and second averaged periodic electronic signals are combined in an exclusive OR circuit to produce the output periodic electronic signal at twice the oscillator frequency. Advantageously, the periodic signal may comprise a desirable duty cycle of 50 percent.

16 Claims, 12 Drawing Sheets

(56) References Cited

U.S. PATENT DOCUMENTS

| | | |
|---|---|---|
| 6,885,253 B2 | 4/2005 | Ahmed |
| 6,885,523 B1 | 4/2005 | Summers et al. |
| 6,917,224 B2 * | 7/2005 | Han ............................. 327/105 |
| 7,312,669 B2 * | 12/2007 | Kinoshita et al. ............... 331/57 |
| 7,420,870 B2 | 9/2008 | Park et al. |
| 2003/0156520 A1 | 8/2003 | Han |
| 2004/0221186 A1 | 11/2004 | Lee et al. |
| 2007/0001771 A1 | 1/2007 | Hori et al. |

* cited by examiner

SIGNAL GENERATOR WITH OUTPUT FREQUENCY GREATER THAN THE OSCILLATOR FREQUENCY

RELATED APPLICATIONS

This Application is a Divisional application of commonly-owned U.S. patent application Ser. No. 12/703,022, now U.S. Pat. No. 8,035,430, entitled "Signal Generator with Output Frequency Greater than the Oscillator Frequency" to Schnaitter and Rozas, filed Feb. 9, 2010, which in turn was a Continuation application of commonly-owned U.S. patent application Ser. No. 11/540,387, now U.S. Pat. No. 7,696,797, entitled "Signal Generator with Output Frequency Greater than the Oscillator Frequency" to Schnaitter and Rozas, filed Sep. 29, 2006. All such applications are hereby incorporated herein by reference in their entirety.

The parent of this application, application Ser. No. 11/540,387, now U.S. Pat. No. 7,696,797, is a Continuation in Part (CIP) of U.S. patent application Ser. No. 11/096,770, now U.S. Pat. No. 7,227,397, entitled "Systems, Methods and Circuits for Generating a Signal" to Schnaitter, filed Mar. 31, 2005, which is incorporated herein by reference in its entirety.

FIELD OF INVENTION

Embodiments of the present invention relate to the field of electronics. More particularly, embodiments of the present invention relate to systems and methods for generating signals having an output frequency greater than the oscillator frequency.

BACKGROUND

Phase locked loop (PLL) circuits are commonly used in integrated circuits, e.g., microprocessors, to provide clock signals to circuitry of the integrated circuit, for example to synchronize logic operations. A conventional PLL circuit consists primarily of a phase detector, a voltage controlled oscillator (VCO) and a power-of-2 frequency divider. A programmable frequency divider may be provided to enable the production of various frequency signals.

A base, or "oscillator" frequency is provided by the voltage controlled oscillator. Depending on a variety of factors, including, for example, a number of stages and an input voltage range, such a VCO can generate frequencies within a particular range, e.g., within an octave between 2.5 GHz and 5.0 GHz. The programmable frequency divider may be used to divide down the frequency of the VCO so that the output of the programmable frequency divider matches the frequency of the input (reference) clock signal.

The phase detector is used to compare the phase of the reference clock signal to the output of the programmable frequency divider to determine if the output clock is too fast or too slow. The phase detector generally outputs control signal(s) to control the VCO in order to slow down or speed up its oscillations so as to match the reference clock signal in both phase and frequency.

The power-of-2 frequency divider divides the VCO output by a power of 2, e.g., 2, 4, 8, etc., to provide a final output frequency. In many designs, this "power-of-2" is at least a factor of two because it is desirable to output a clock signal with a duty cycle very close to 50 percent. For example, many synchronous logic designs utilize both rising and falling edges of clock signals, and require minimum set-up and hold times from such edges. In general, the output of a VCO does not have a 50 percent duty cycle and dividing its output signal by a factor of two generally produces a clock signal with very close to a 50 percent duty cycle.

Unfortunately, this widely used conventional PLL implementation limits the clock signal output to a maximum of one half of the maximum frequency of the VCO. In many integrated circuits, e.g., microprocessors, it is generally desirable to utilize an accurate clock signal of a frequency that is greater than this limit.

SUMMARY OF THE INVENTION

Therefore, a need exists for systems and methods for design and operation of signal generating circuitry characterized with output frequencies greater than the oscillator frequency. A need also exists for generating such output frequencies with a duty cycle desirably close to 50 percent. A further need exists for systems and methods for design and operation of signal generating circuitry with output frequencies greater than the oscillator frequency that are compatible and complementary with existing electronic and semiconductor design and manufacturing techniques.

Accordingly, in a first method embodiment, a method of producing an output periodic electronic signal comprises accessing a first periodic electronic signal at a first frequency and accessing a second periodic electronic signal at the first frequency and characterized as having a one half cycle phase relationship with the first periodic electronic signal. The method further includes accessing a third periodic electronic signal having the first frequency and characterized as having a one quarter cycle phase relationship with the first periodic electronic signal and accessing a fourth periodic electronic signal having the first frequency and characterized as having a one half cycle phase relationship with the third periodic electronic signal. The first and the second periodic electronic signals are averaged to produce a first averaged periodic electronic signal, and the third and the fourth periodic electronic signals are averaged to produce a second averaged periodic electronic signal. The first and second averaged periodic electronic signals are combined in an exclusive OR circuit to produce the output periodic electronic signal at twice the first frequency.

In accordance with another embodiment of the present invention, a phase locked loop electronic circuit comprises a controlled oscillator for generating a periodic signal at an oscillator frequency and a frequency doubling circuit for producing a PLL output frequency that is twice the oscillator frequency. The phase locked loop further comprises a phase/frequency detector for comparing a feedback signal derived from the oscillator frequency with a reference frequency and for generating a control signal to the controlled oscillator to control the periodic signal.

In accordance with another method embodiment of the present invention, second and third periodic electronic signals at an oscillation frequency and having a phase difference of one quarter cycle are generated. The second and third periodic electronic signals are combined to produce the periodic electronic signal at twice the oscillation frequency.

BRIEF DESCRIPTION OF THE DRAWINGS

The accompanying drawings, which are incorporated in and form a part of this specification, illustrate embodiments of the invention and, together with the description, serve to explain the principles of the invention. Unless otherwise noted, the figures are not drawn to scale.

DETAILED DESCRIPTION

Reference will now be made in detail to various embodiments of the invention, examples of which are illustrated in the accompanying drawings. While the invention will be described in conjunction with these embodiments, it is understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, it will be recognized by one of ordinary skill in the art that the invention may be practiced without these specific details. In other instances, well known methods, procedures, components, and circuits have not been described in detail as not to unnecessarily obscure aspects of the invention.

Signal Generation with Output Frequency Greater than the Oscillator Frequency

Figure 1A:
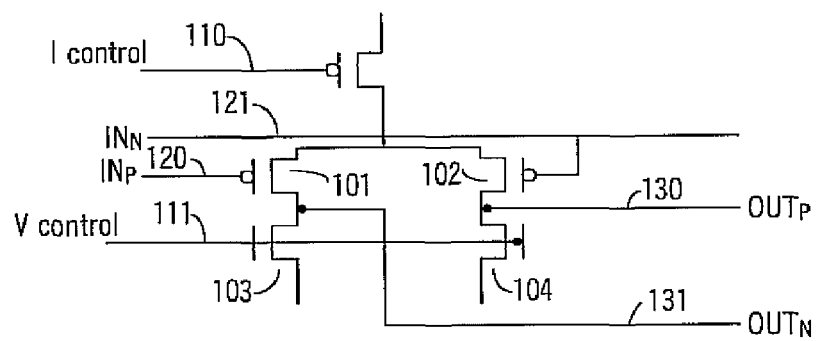
FIG. 1A illustrates an exemplary differential Voltage Controlled Oscillator (VCO) stage, in accordance with embodiments of the present invention.
Figure 1B:
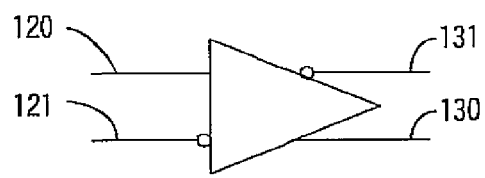
FIG. 1B illustrates a schematic symbol for a VCO stage of FIG. 1, in accordance with embodiments of the present invention.

FIG. 1A illustrates a schematic of an exemplary differential Voltage Controlled Oscillator (VCO) stage 100, in accordance with embodiments of the present invention. Differential VCO stage 100 accesses a signal, e.g., at input INp 120, to produce an amplified, delayed and inverted signal OUTn 131. Likewise, VCO stage 100 accesses signal INn 121 to produce an amplified, delayed and inverted signal OUTp 130. Signal Icontrol 110 allows for adjustment of current through stage 100. The oscillation frequency of voltage controlled oscillator stage 100 is controlled by signal Vcontrol 111. For example, an increased voltage on signal Vcontrol 111 decreases a propagation delay through VCO stage 100. FIG. 1B illustrates a schematic symbol 150 for VCO stage 100 (FIG. 1), in accordance with embodiments of the present invention. It is appreciated that the voltage control signal Vcontrol 111 and current control signal Icontrol 110 are not shown.

Figure 2:
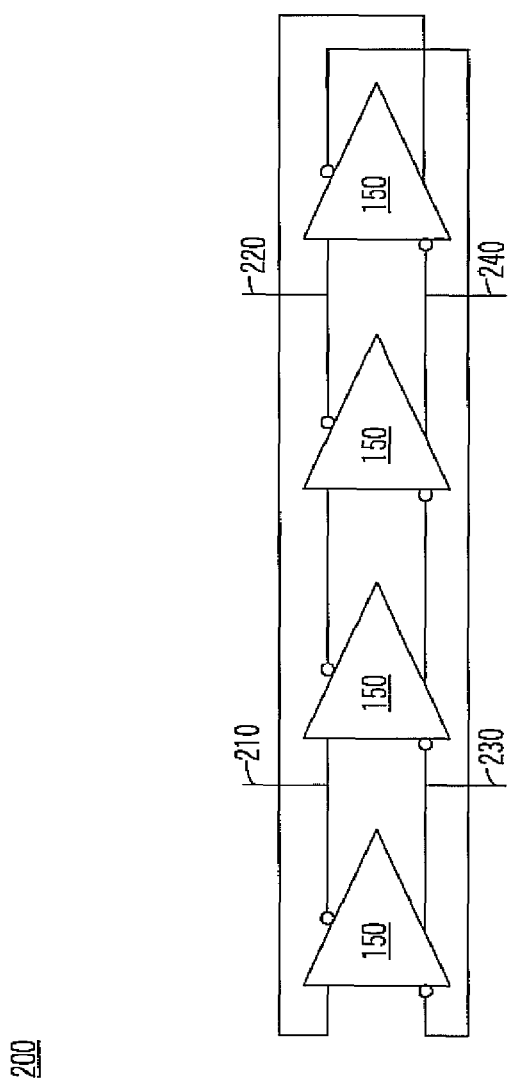
FIG. 2 illustrates an exemplary differential voltage controlled oscillator (VCO), in accordance with embodiments of the present invention.

FIG. 2 illustrates an exemplary differential voltage controlled oscillator (VCO) 200, in accordance with embodiments of the present invention. Differential VCO 200 comprises four instances of differential VCO stage 150 (FIG. 1B). VCO 200 produces a quadrature clock signal. For example, VCO 200 produces a first periodic signal and three other delayed versions of that signal. For example, VCO 200 produces a second periodic signal of the same frequency as the first periodic signal, but delayed with respect to the first periodic signal by one quarter of the period. Likewise, VCO 200 produces a third periodic signal delayed by one half of the period, and a fourth periodic signal delayed by three quarters of the period. These signals may be accessed at taps 210, 220, 230 and/or 240. It is appreciated that periodic signals may be accessed at other portions of VCO 200 in accordance with embodiments of the present invention.

Figure 3:
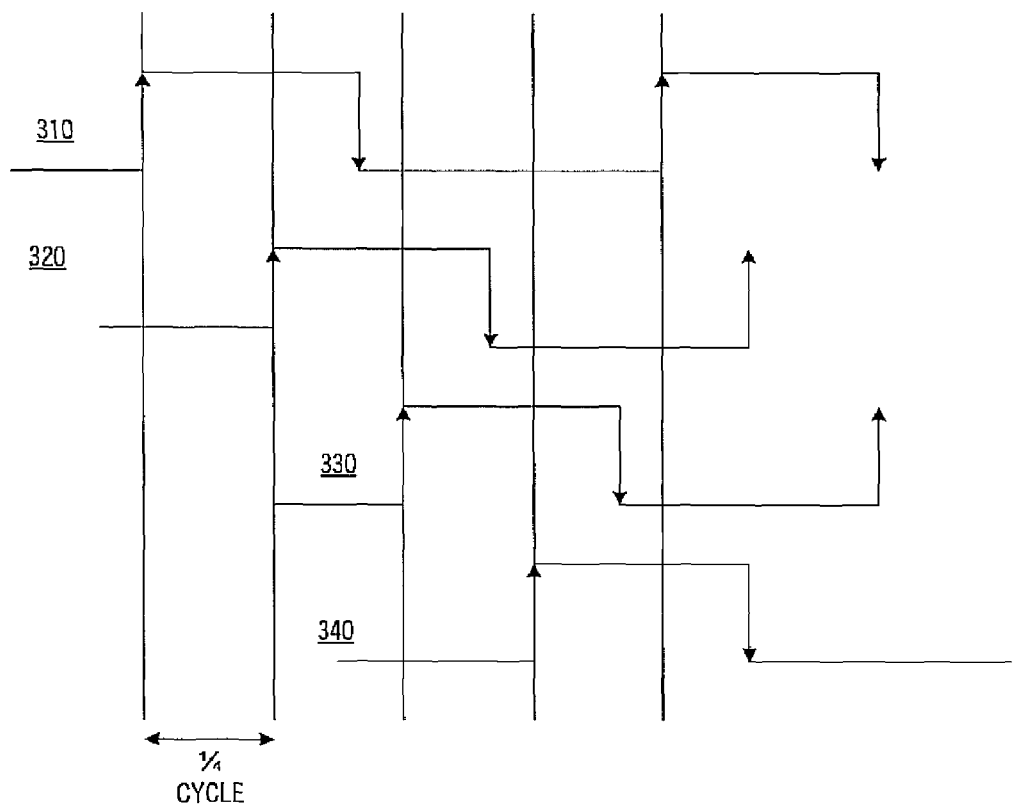
FIG. 3 illustrates exemplary quadrature periodic signal waveforms as may be generated by the differential voltage controlled oscillator of FIG. 2, in accordance with embodiments of the present invention.

FIG. 3 illustrates exemplary quadrature periodic signal waveforms 300 as may be generated by differential voltage controlled oscillator 200 (FIG. 2), in accordance with embodiments of the present invention. Rising and falling edges of each waveform are signified by arrows to illustrate phase relationships among the several waveforms. For example, each arrow signifies a corresponding phase of the several waveforms. It is appreciated that only portions of these signals are illustrated. In a steady state condition, such signals are substantially continuous.

Waveform 310 illustrates a periodic signal accessed at tap 210 of differential voltage controlled oscillator 200 (FIG. 2). Waveform 330 illustrates a periodic signal accessed at tap 230 of differential voltage controlled oscillator 200 (FIG. 2). It is appreciated that waveform 330 may be one half period, 180 degrees or $\pi$ (pi) radians out of phase with waveform 310.

In a similar manner, waveform 320 illustrates a periodic signal accessed at tap 220 of differential voltage controlled oscillator 200 (FIG. 2). Waveform 320 may be one quarter period, 90 degrees or $\pi/2$ radians out of phase with waveform 310. Likewise, waveform 340 illustrates a periodic signal accessed at tap 240 of differential voltage controlled oscillator 200 (FIG. 2). Waveform 340 may be three quarters of a period, 270 degrees or $3\pi/2$ radians out of phase with waveform 310. For example, waveform 340 may be one half period, 180 degrees or $\pi$ (pi) radians out of phase with waveform 320.

It is to be appreciated that each differential VCO stage 150 (FIG. 1A) outputs a waveform and a negated version of the waveform. For example, a negated output waveform comprises a falling edge at substantially the same point in time that the output waveform comprises a rising edge. In accordance with embodiments of the present invention, the above-described phase relationships of waveforms 310, 320, 330 and 340 are forced toward an exact quadrature relationship.

It is to be appreciated, however, that waveforms 310, 320, 330 and 340, as illustrated in FIG. 3, and as generally produced by an oscillator, e.g., differential voltage controlled oscillator 200 (FIG. 2), are not characterized as having a 50 percent duty cycle. For example, waveforms 310, 320, 330 and 340 are "low" for a greater duration than they are "high." A standard definition of duty cycle relates a "high" duration to the total period of a cycle. Accordingly, waveforms 310, 320, 330 and 340 have less than a 50 percent duty cycle. As illustrated, waveforms 310, 320, 330 and 340 are characterized as having about a 44 percent duty cycle.

Figure 4:
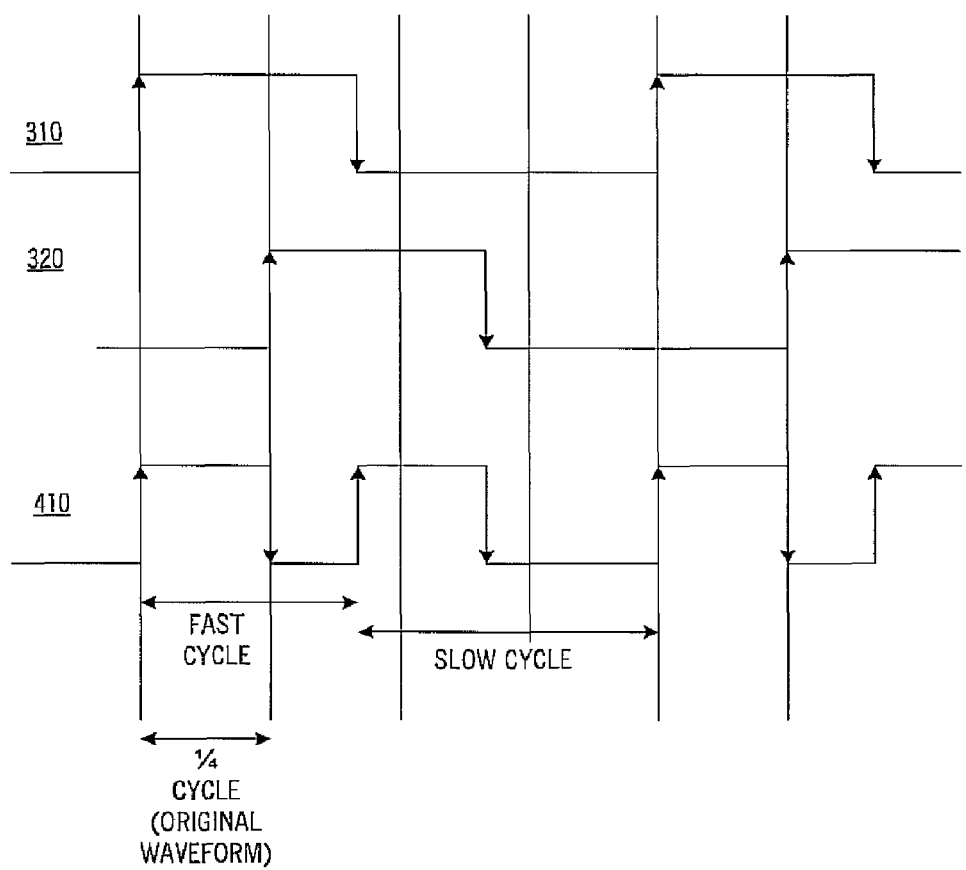
FIG. 4 illustrates an XOR combination of two signals, in accordance with embodiments of the present invention.

In accordance with embodiments of the present invention, two signals comprising a 90 degree or π/2 radian phase relationship, e.g., waveforms 310 and 320 of FIG. 3, may be combined via an exclusive OR (XOR) logical relation to produce a signal of twice the frequency of the original signals. FIG. 4 illustrates an XOR combination of two such signals, in accordance with embodiments of the present invention.

In FIG. 4, waveform 410 is illustrated as an XOR combination of waveform 310 with waveform 320. It is appreciated that waveforms 310 and 320 are characterized as having a 90 degree or π/2 radian phase relationship. When waveform 310 is high, but waveform 320 is low, waveform 410 is high. When both waveforms 310 and 320 are high, waveform 410 is low. When waveform 310 is low but waveform 320 is high, waveform 410 is high again. When both waveforms 310 and 320 are low, waveform 410 is also low.

If, as illustrated in FIGS. 3 and 4, the duty cycle of input waveforms 310 and 320 are not close to 50 percent, the resulting waveform 410 is not single cycle periodic. For example, in one cycle, waveform 410 is more than twice the frequency of waveforms 310, 320. In another cycle, waveform 410 is less than twice the frequency of waveforms 310, 320. In addition, no cycle of waveform 410 is characterized as having a duty cycle of 50 percent. In general, waveform 410 would not be suitable as a clocking signal for digital logic.

Referring once again to FIGS. 1A and 1B, in some circumstances output signals 130 and/or 131 may not be desirable for use with digital circuitry. For example, the output signals may comprise an unacceptable DC bias voltage and/or the voltage difference between high and low levels may be insufficient to switch digital logic circuitry. Current control signal 110 may be utilized to at least partially compensate for such conditions. However, in some situations, it may be desirable to condition output signals for use with digital circuitry.

Figure 5:
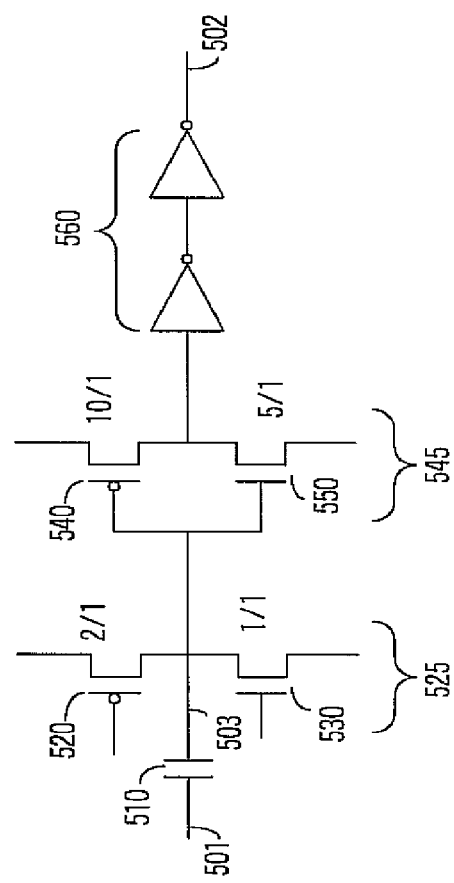
FIG. 5 illustrates an exemplary circuit for conditioning an output signal of an oscillator stage, in accordance with embodiments of the present invention.

FIG. 5 illustrates an exemplary circuit 500 for conditioning an output signal of an oscillator stage, in accordance with embodiments of the present invention. Conditioning circuit 500 may be functionally included within an oscillator stage, e.g., included within differential Voltage Controlled Oscillator (VCO) stage 100 circuitry and not shown explicitly with schematic symbol 150. Alternatively, conditioning circuit 500 may be shown as a separate block in schematic representations.

Conditioning circuit 500 accesses an input signal 501, e.g., output 131 of differential VCO stage 100 (FIG. 1). The input signal 501 is AC coupled by capacitor 510 to produce AC coupled signal 503. Weak inverter 525, comprising p channel device 520 and n channel device 530, bias AC coupled signal 503 to a desirable DC level, e.g., Vcc/2. More particularly, the desirable DC level of AC coupled signal 503 should be about the inversion point of inverter 545. P channel device 520 is sized larger than n channel device 530 so as to produce the desired DC level. The exemplary sizes shown in FIG. 5 are for illustration. In general, the size relationship of device 540 to device 550 should be the same as the size relationship of device 520 to device 530. Actual transistor sizes may be determined based upon the circuit application and well known semiconductor engineering principles.

Conditioning circuit 500 further comprises an inverter 545. Inverter 545 comprises p channel device 540 and n channel device 550. P channel device 540 is sized larger than n channel device 550 so as to produce approximately the same transistor "strength" for up transitions as for down transitions.

Inverter 545 serves to provide signals with appropriate high and low levels for use by digital circuitry. The exemplary sizes shown in FIG. 5 are for illustration. Actual transistor sizes may be determined based upon the circuit application and well known semiconductor engineering principles.

Optional inverters 560 may be typical digital logic inverters, e.g., as utilized for logic design within an integrated circuit, and may be utilized to provide buffering to output signal 502.

In some circumstances the output of an oscillator stage, e.g., output signal 131 of differential voltage controlled oscillator stage 100 (FIG. 1A), may not comprise a duty cycle desirably close to 50 percent. For example, such an output signal may be "high" for 44 percent of a cycle and "low" for 56 percent of a cycle. In such a circumstance, an exclusive OR (XOR) combination of two such signals having a one quarter cycle, 90 degree or π/2 radian phase relationship will generally generate a complex waveform that does not oscillate with single cycle regularity. For example, waveform 410 of FIG. 4 illustrates such a resulting waveform. Such a complex, irregularly oscillating waveform is generally undesirable for use as a clock signal with digital logic.

Figure 6A:
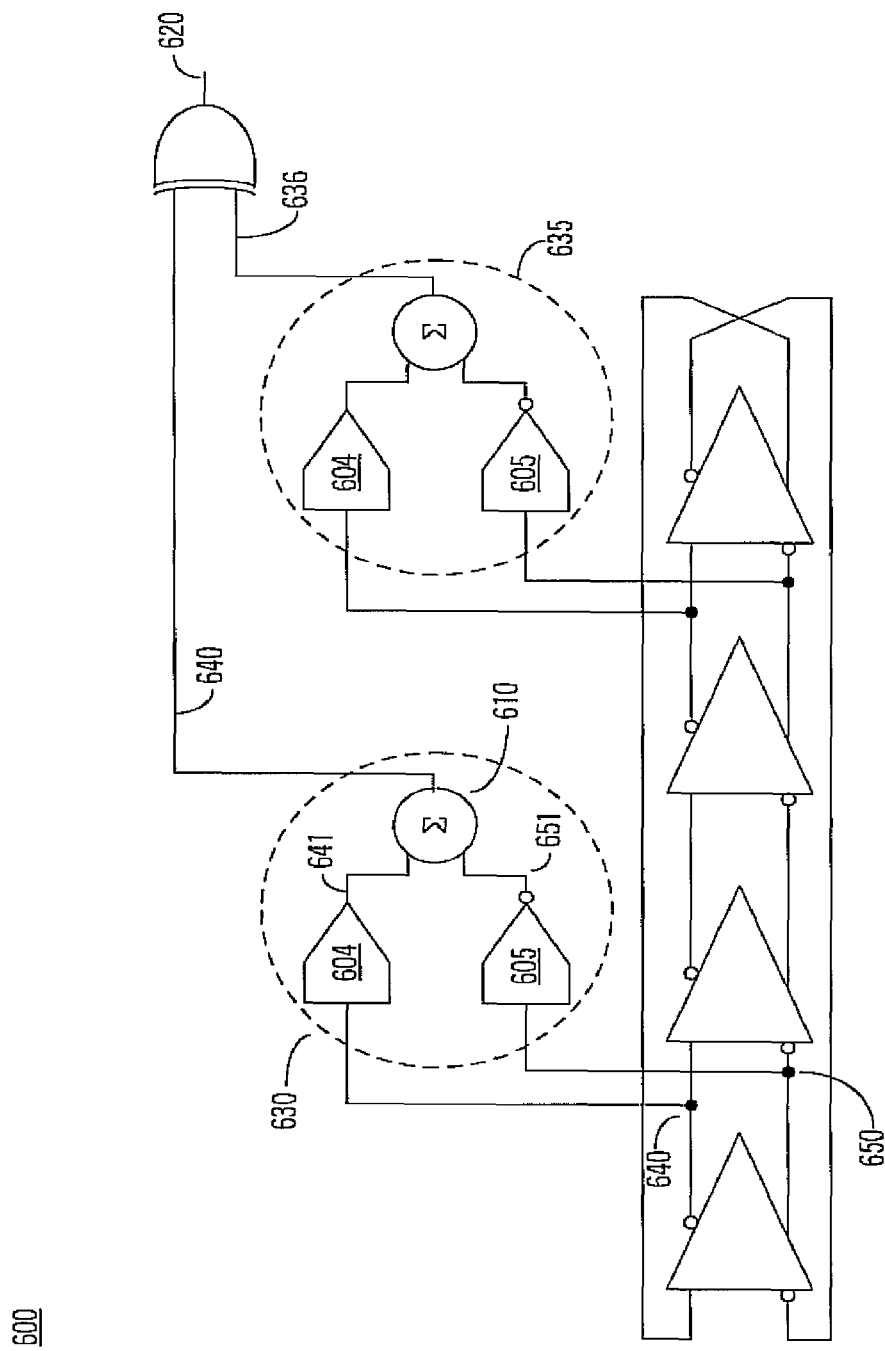
FIG. 6A illustrates exemplary duty cycle averaging circuitry as a part of signal generating circuitry, in accordance with embodiments of the present invention.

FIG. 6A illustrates exemplary duty cycle averaging circuitry 630 as a part of signal generating circuitry 600, in accordance with embodiments of the present invention. Duty cycle averaging circuitry is discussed in greater detail in co-pending, commonly-owned U.S. patent application Ser. No. 11/096,770, now U.S. Pat. No. 7,696,797, entitled "Systems, Methods and Circuits for Generating a Signal" to Schnaitter, filed Mar. 31, 2005, which is incorporated herein by reference in its entirety.

Signal generating circuitry 600 comprises an oscillator that includes four differential oscillation stages, e.g., four instances of differential VCO stage 200 (FIG. 2). It is appreciated that control inputs, if present, are not shown. The oscillator may also be a free running oscillator, in accordance with embodiments of the present invention. It is appreciated that the differential oscillation stages may include conditioning circuitry, e.g., conditioning circuit 500, as described with respect to FIG. 5.

Figure 6B:
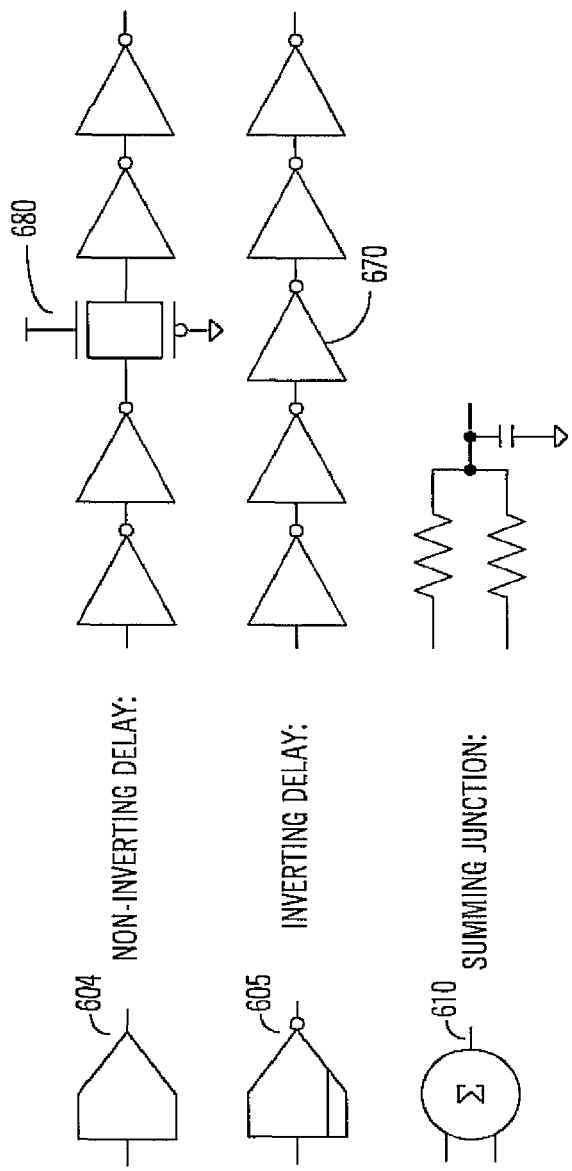
FIG. 6B provides further illustration of the details of circuits shown in FIG. 6A, in accordance with embodiments of the present invention.

Duty cycle averaging circuitry 630 comprises a non-inverting delay circuit 604, an inverting delay circuit 605 and a summing junction circuit 610. FIG. 6B provides further illustration of the details of circuits 604, 605 and 610, in accordance with embodiments of the present invention. Non-inverting delay circuit 604 and inverting delay circuit 605 should have substantially the same amount of delay. For example, the signal propagation delay through the pass gate 680 of non-inverting delay circuit 604 may be substantially the same as the signal propagation delay through the middle inverter 670 of inverting delay circuit 605.

With reference to FIG. 6A, duty cycle averaging circuitry 630 accesses periodic signal 640 and its corresponding one-half period delayed periodic signal 650. In an instance of non-inverting delay circuit 604, periodic signal 640 is delayed to produce periodic signal 641. One-half period delayed periodic signal 650 is delayed by an instance of non-inverting delay circuit 604 to produce periodic signal 651. It is appreciated that periodic signals 641 and 651 should have the same phase relationship, e.g., they are now in phase.

Signals 641 and 651 are summed at an instance of summing junction 610 to produce signal 640'. In this novel manner, duty cycle averaging circuitry 630 generates a signal 640' of the same frequency as signal 640 with improved duty cycle. For example, the duty cycle of signal 640' is closer to 50 percent than the duty cycle of signal 640 or signal 650.

In a similar manner, duty cycle averaging circuitry 635 generates signal 636 that has an improved duty cycle relative to the accessed output signals of the differential VCO stage 150. It is appreciated that signal 636 is one quarter cycle, 90 degrees or π/2 radians out of phase with signal 640'.

Signals 640' and 636 are combined via exclusive OR (XOR) logic to produce output signal 620. As described previously, an XOR combination of signals having a one-quarter cycle phase relationship and close to a 50 percent duty cycle will produce a signal of twice the frequency of the input signals. Advantageously, signals 640' and 636 comprise improved duty cycles. As a beneficial result, output signal 620 is generally periodic, is characterized as having about a 50 percent duty cycle, and is useful as a clock signal in digital circuitry.

Figure 7:
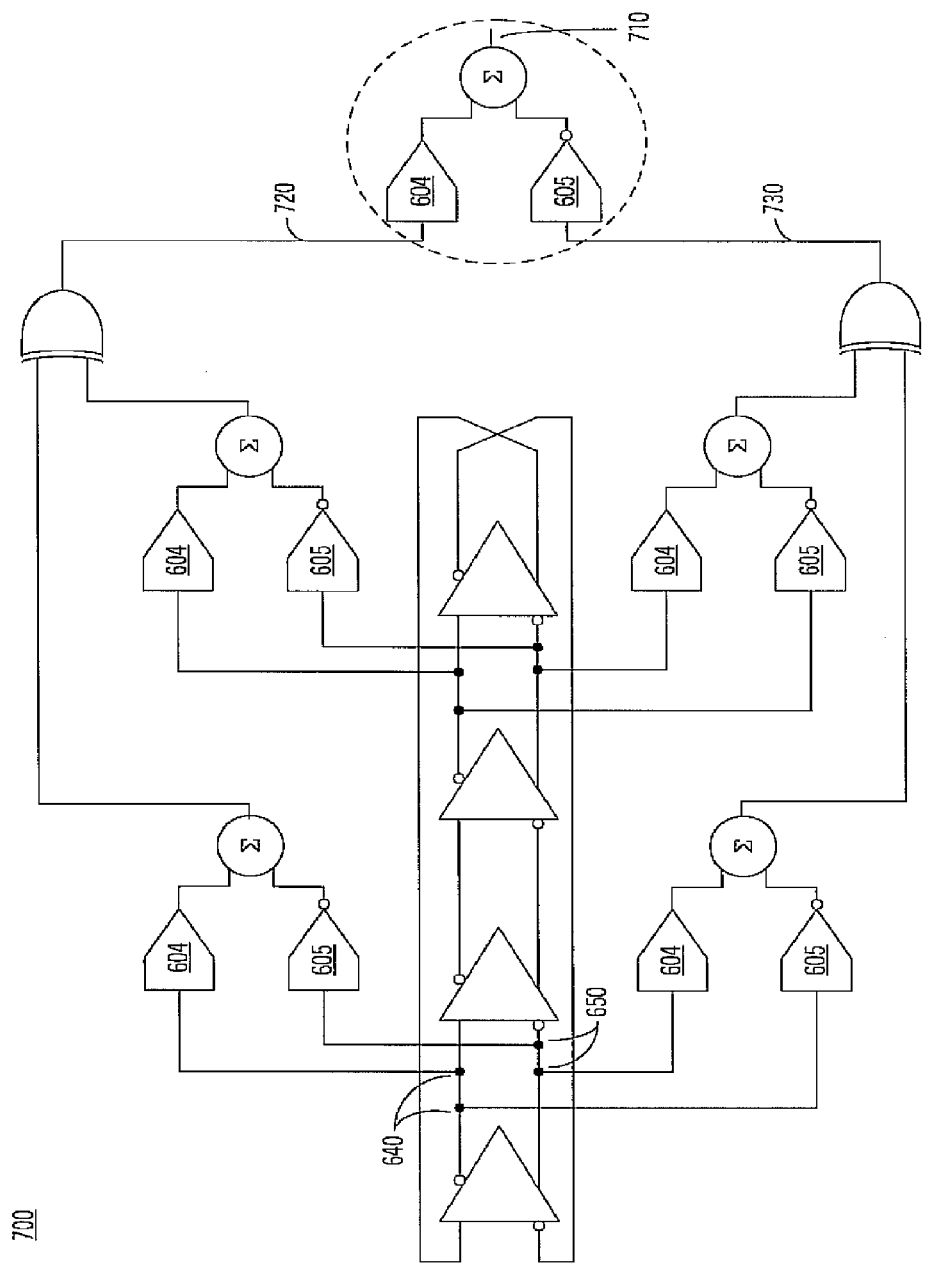
FIG. 7 illustrates signal generating circuitry, in accordance with embodiments of the present invention.

FIG. 7 illustrates signal generating circuitry 700, in accordance with embodiments of the present invention. Signal generating circuitry 700 comprises an oscillator, e.g., differential voltage controlled oscillator 200 (FIG. 2). Signal generating circuitry 700 comprises five instances of duty cycle averaging circuitry, e.g., duty cycle averaging circuit 630 (FIG. 6). Signals 720 and 730 oscillate at twice the frequency of the differential oscillator. Duty cycle averaging circuitry 740 averages the duty cycles of signals 720 and 730 to produce an output signal 710 that has a further improved, e.g., still closer to 50 percent, duty cycle relative to the duty cycles of signals 720 and 730.

In accordance with an embodiment of the present invention, both the asserted and deasserted, or negated, outputs of a differential oscillator stage, e.g., differential VCO stage 100 (FIG. 1), are routed through instances of both inverting delay stage 605 and non-inverting delay stage 604. For example, signal 640 is routed "up" to an instance of non-inverting delay stage 604 and "down" to an instance of inverting delay stage 605. Likewise, signal 650 is routed through both inverting and non-inverting delay stages. In this novel manner, any delay mismatch between inverting delay stage 605 and non-inverting delay stage 604 is averaged, diminishing a potential deleterious effect of such a delay mismatch.

Figure 8:
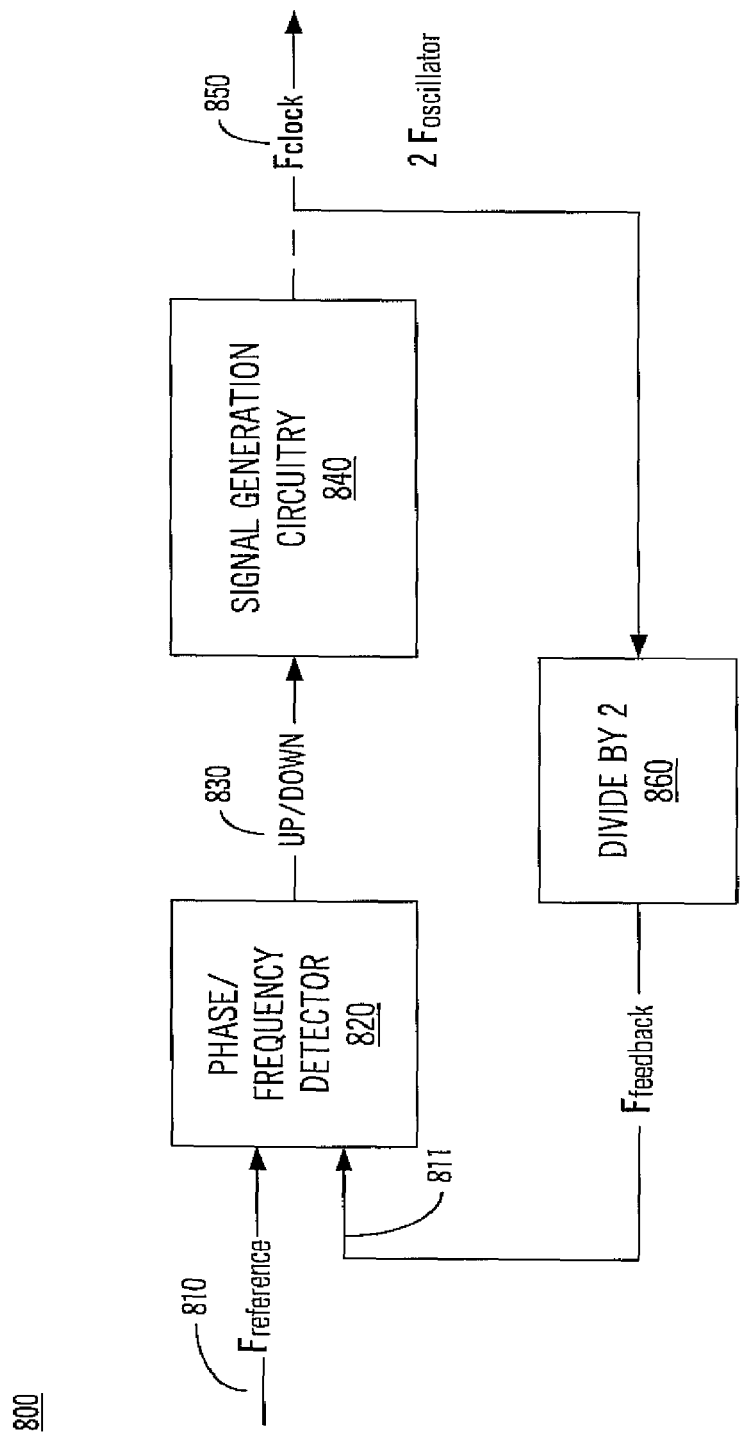
FIG. 8 illustrates an exemplary phase locked loop (PLL) circuit, in accordance with embodiments of the present invention.

FIG. 8 illustrates an exemplary phase locked loop (PLL) circuit 800, in accordance with embodiments of the present invention. PLL circuit 800 comprises a phase/frequency detector 820. Phase/frequency detector 820 access a reference frequency 810 and compares reference frequency 810 with feedback frequency 811. Phase/frequency detector 820 generates up/down control signal(s) 830. Up/down control signal(s) 830 control a controllable oscillator in signal generating circuitry 840, e.g., (along with a conventional PLL charge pump and loop filter) a voltage controlled oscillator, to increase or decrease a frequency of oscillation. The controllable oscillator oscillates at an oscillator frequency.

Signal generating circuitry 840 may comprise, for example, signal generating circuitry 600 (FIG. 6) or signal generating circuitry 700 (FIG. 7). Signal generating circuitry 840 outputs a periodic signal 850 comprising a duty cycle of substantially 50 percent. It is appreciated that periodic signal 850 has a frequency of twice the oscillator frequency. Periodic signal 850 is divided by two by divide-by-two-circuitry 860 so that feedback frequency 811 corresponds in frequency to reference frequency 810. It is appreciated that such a divide-by-two function may be implemented by a general or programmable frequency divider circuit, as such frequency dividing circuits are often utilized with PLL circuitry.

It is appreciated that additional frequency dividers, e.g., a programmable frequency divider, may be inserted into the feedback loop of PLL 800 in well known manners, and that such embodiments are considered within the scope of the present invention. Such frequency dividers generally enable a controllable oscillator to operate at multiples of a reference frequency, e.g., reference frequency 810.

Figure 9:
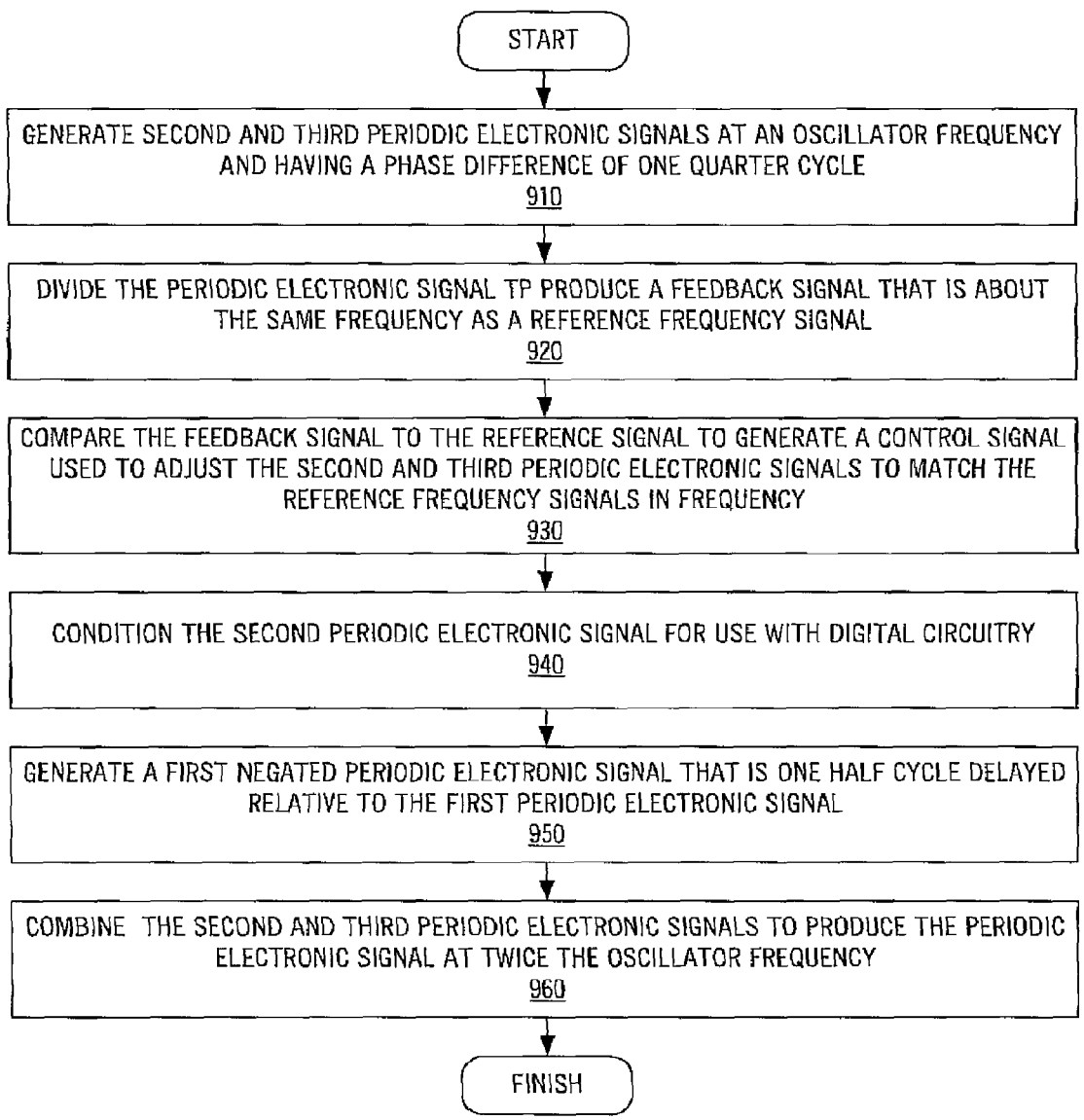
FIG. 9 is a flow chart of an exemplary method for producing a periodic electronic signal, in accordance with embodiments of the present invention.

FIG. 9 is a flow chart of an exemplary method 900 for producing a periodic electronic signal, in accordance with embodiments of the present invention. In 910, second and third periodic electronic signals at an oscillator frequency and having a phase difference of one quarter cycle are generated.

In optional 920, the periodic electronic signal is divided to produce a feedback signal that is about the same frequency as a reference frequency signal. For example, if the oscillator frequency is about the same as the frequency of the reference signal, the divisor should be two. If the oscillation frequency is a multiple of the reference frequency, then the divisor should be twice that multiple. The dividing may be performed by a dedicated frequency divider, or as part of a general or programmable frequency divider.

In optional 930, the feedback signal is compared to the reference signal to generate a control signal used to adjust the second and third periodic electronic signals to match the reference frequency signals in frequency.

In optional 940, the second periodic electronic signal is conditioned for use with digital circuitry. Such conditioning may comprise, for example, adjusting a DC bias level to a switching point of digital logic circuits and/or adjusting high and/or low voltage levels to correspond to digital logic levels.

In optional 950, a first negated periodic electronic signal that is one half cycle delayed relative to the first periodic electronic signal is generated. The first periodic electronic signal and the first negated periodic electronic signal are combined to average their duty cycles.

In 960, the second and third periodic electronic signals are combined to produce the periodic electronic signal at twice the oscillator frequency. The periodic signal may comprise a duty cycle of 50 percent. The combining may utilize, for example, an exclusive OR gate, as illustrated in FIG. 7.

In this novel manner, embodiments in accordance with the present invention provide for generating periodic signals, e.g., synchronizing clock signals, at a frequency that is twice the local oscillator frequency with a desirable duty cycle suitable for use with digital logic circuits. In general, these periodic signals oscillate at four times the frequency of comparable signals under the conventional art. Advantageously, such higher frequency signals may enable digital circuits, including, e.g., microprocessors, to operate faster in comparison to the conventional art.

Figure 10:
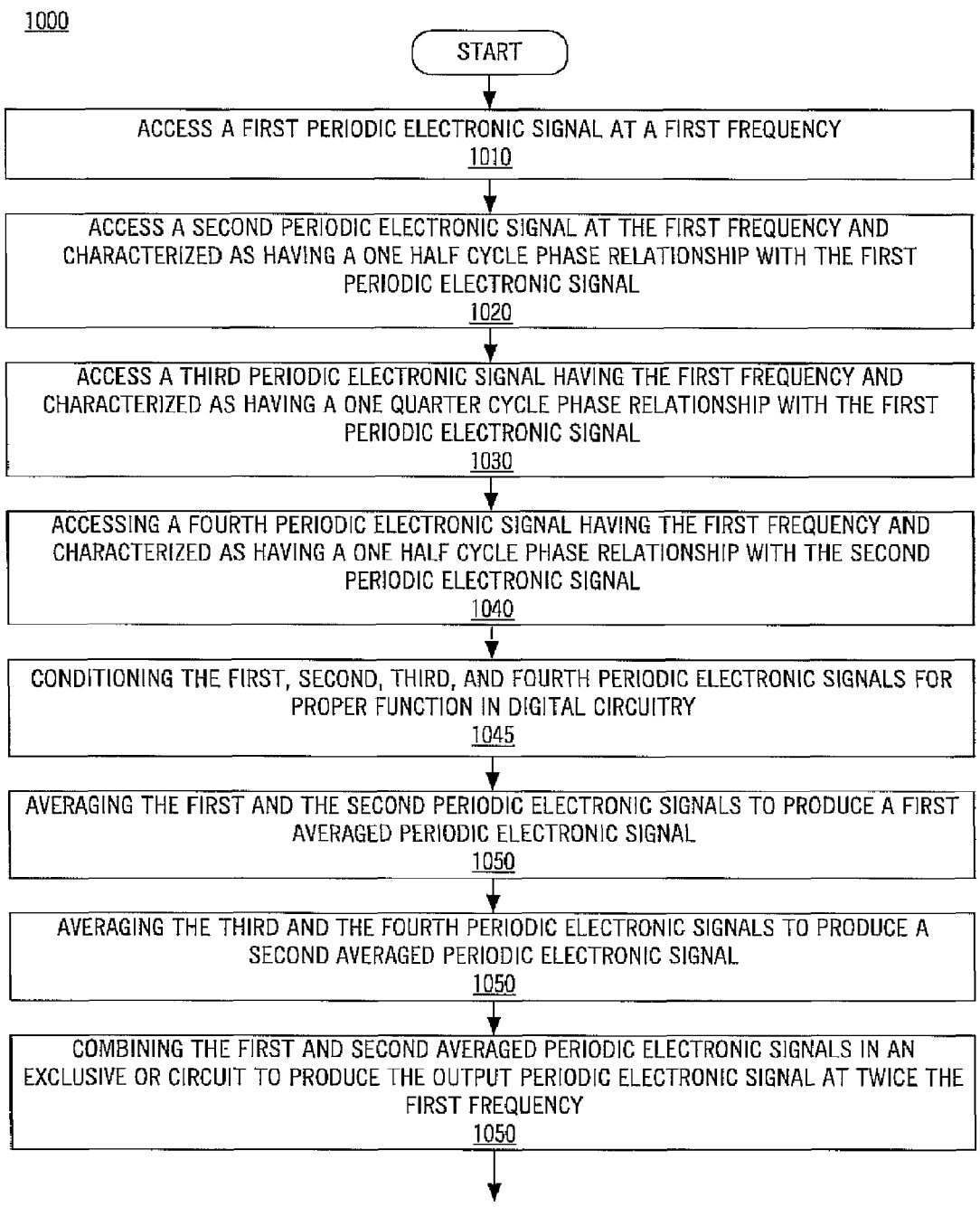
FIG. 10 is a flow chart of an exemplary method for producing an output periodic electronic signal, in accordance with embodiments of the present invention.
Figure 10:
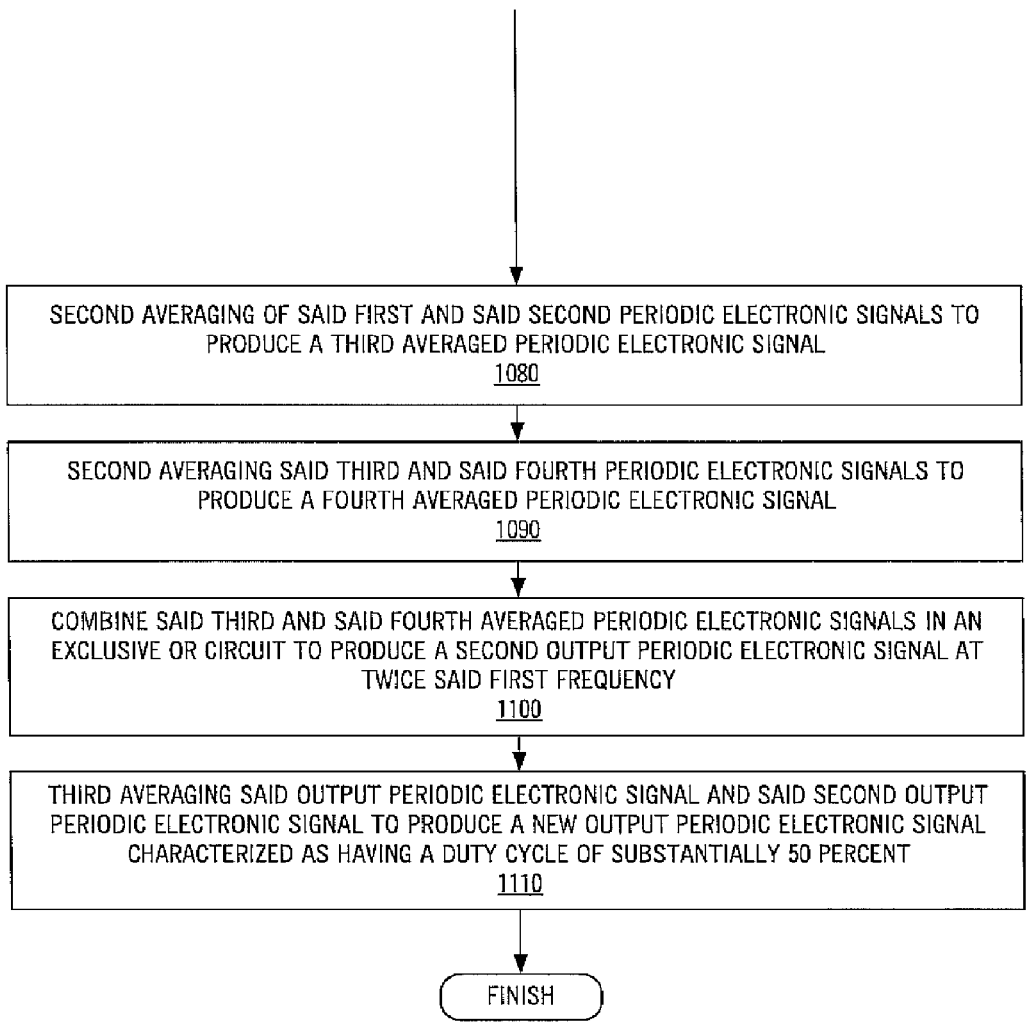
Figure 10:
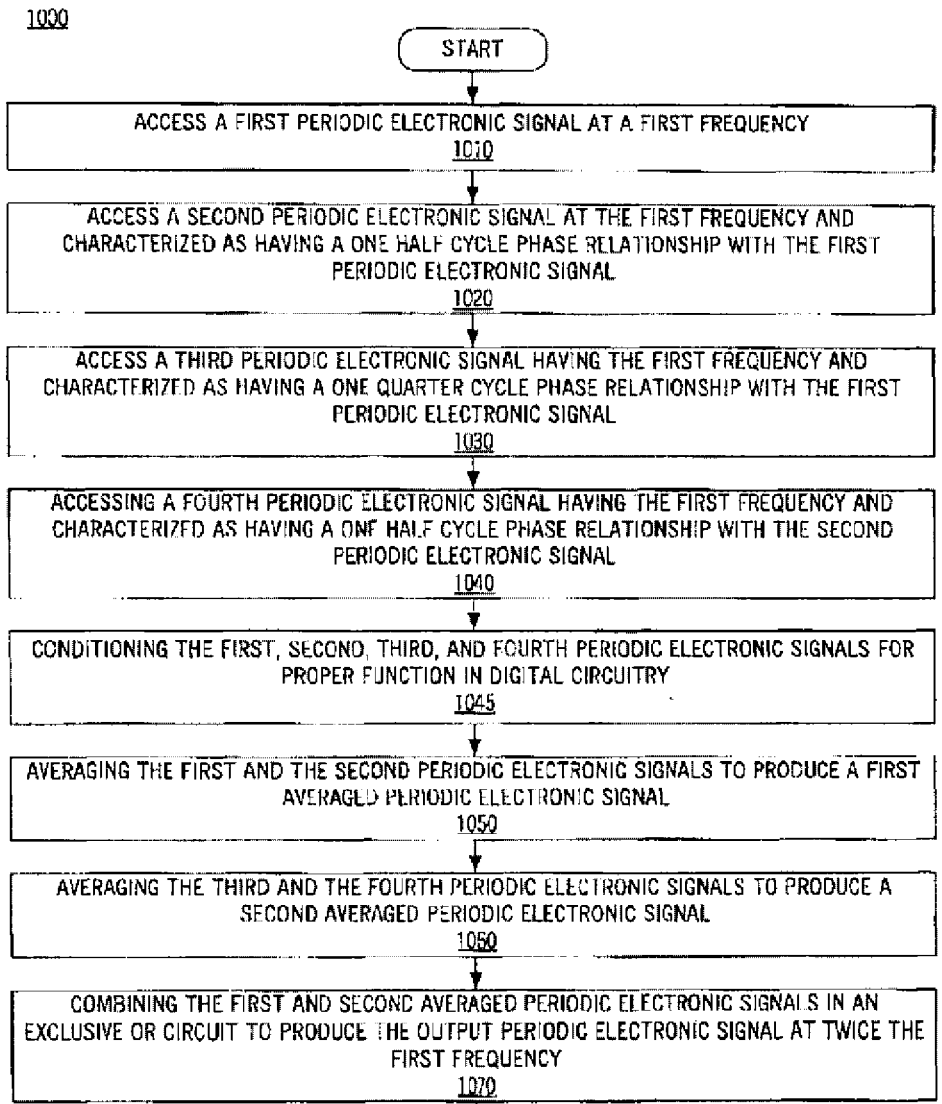

FIG. 10 is a flow chart of an exemplary method 1000 for producing an output periodic electronic signal, in accordance with embodiments of the present invention. In 1010, a first periodic electronic signal at a first frequency is accessed.

In 1020, a second periodic electronic signal at the first frequency and characterized as having a one half cycle phase relationship with the first periodic electronic signal is accessed. In 1030, a third periodic electronic signal having the first frequency and characterized as having a one quarter cycle phase relationship with the first periodic electronic signal is accessed.

In 1040, a fourth periodic electronic signal having the first frequency and characterized as having a one half cycle phase relationship with the third periodic electronic signal is accessed. In optional 1045, the first, second, third and fourth periodic electronic signals are conditioned for proper function in digital circuitry prior to the averaging.

In 1050, the first and the second periodic electronic signals to produce a first averaged periodic electronic signal are averaged, e.g., via signal averaging circuitry illustrated in FIG. 7.

In 1060, the third and the fourth periodic electronic signals to produce a second averaged periodic electronic signal are averaged.

In 1070, the first and second averaged periodic electronic signals are combined in an exclusive OR circuit to produce the output periodic electronic signal at twice the first frequency.

In optional 1080, second averaging of the first and the second periodic electronic signals is performed to produce a third averaged periodic electronic signal. In optional 1090, second averaging the third and the fourth periodic electronic signals is performed to produce a fourth averaged periodic electronic signal.

In optional 1100, the third and the fourth averaged periodic electronic signals are combined in an exclusive OR circuit to produce a second output periodic electronic signal at twice the first frequency. In optional 1110, third averaging of the output periodic electronic signal and the second output periodic electronic signal is performed to produce a new output periodic electronic signal characterized as having a duty cycle of substantially 50 percent.

Embodiments in accordance with the present invention provide for systems and methods for design and operation of signal generating circuitry with output frequencies greater than the oscillator frequency. Embodiments in accordance with the present invention also provide for generating such output frequencies with a duty cycle desirably close to 50 percent. Further, embodiments in accordance with the present invention provide for systems and methods for design and operation of signal generating circuitry with output frequencies greater than the oscillator frequency that are compatible and complementary with existing electronic and semiconductor design and manufacturing techniques.

Various embodiments of the invention are thus described. While the present invention has been described in particular embodiments, it should be appreciated that the invention should not be construed as limited by such embodiments, but rather construed according to the below claims.

What is claimed is:

1. A method comprising:
    accessing a first periodic electronic signal at a first frequency;
    accessing a second periodic electronic signal at said first frequency, said second periodic electronic signal characterized as having a one half cycle phase relationship with said first periodic electronic signal;
    accessing a third periodic electronic signal having said first frequency and characterized as having a one quarter cycle phase relationship with said first periodic electronic signal;
    accessing a fourth periodic electronic signal having said first frequency and characterized as having a one half cycle phase relationship with said third periodic electronic signal;
    averaging said first and said second periodic electronic signals to produce a first averaged periodic electronic signal;
    averaging said third and said fourth periodic electronic signals to produce a second averaged periodic electronic signal,
    wherein said averaging produces an output signal with a duty cycle closer to 50% than a duty cycle of an input signal; and
    combining said first and second averaged periodic electronic signals in an exclusive OR circuit to produce an output periodic electronic signal at twice said first frequency.

2. The method of claim 1 wherein said output periodic electronic signal is characterized as having single cycle periodicity.

3. The method of claim 1 wherein said output periodic electronic signal is characterized as having a duty cycle of substantially 50 percent.

4. The method of claim 1 wherein said first periodic electronic signal is characterized as having a duty cycle of less than 47 percent or more than 53 percent.

5. The method of claim 1 wherein said averaging comprises passing one signal through an inverting delay circuit and the other signal through a non-inverting delay circuit.

6. The method of claim 5 wherein said inverting delay circuit and said non-inverting delay circuit are characterized as having about the same delay time.

7. The method of claim 1 further comprising conditioning said first, second, third and fourth periodic electronic signals for proper function in digital circuitry prior to said averaging.

8. The method of claim 1 further comprising:
    second averaging of said first and said second periodic electronic signals to produce a third averaged periodic electronic signal;
    second averaging said third and said fourth periodic electronic signals to produce a fourth averaged periodic electronic signal;
    combining said third and said fourth averaged periodic electronic signals in an exclusive OR circuit to produce a second output periodic electronic signal at twice said first frequency; and
    third averaging said output periodic electronic signal and said second output periodic electronic signal to produce a new output periodic electronic signal characterized as having a duty cycle of substantially 50 percent.

9. A system comprising:
    circuitry configured to generate a first periodic electronic signal at a first frequency;
    circuitry configured to generate a second periodic electronic signal at said first frequency, said second periodic electronic signal characterized as having a one half cycle phase relationship with said first periodic electronic signal;
    circuitry configured to generate a third periodic electronic signal having said first frequency and characterized as having a one quarter cycle phase relationship with said first periodic electronic signal;
    circuitry configured to generate a fourth periodic electronic signal having said first frequency and characterized as having a one half cycle phase relationship with said third periodic electronic signal;
    circuitry configured to average said first and said second periodic electronic signals to produce a first averaged periodic electronic signal characterized as having an improved duty cycle over a duty cycle of said first and said second periodic electronic signals;
    circuitry configured to average said third and said fourth periodic electronic signals to produce a second averaged periodic electronic signal characterized as having an improved duty cycle over a duty cycle of said third and said fourth periodic electronic signals; and
    circuitry configured to combine said first and second averaged periodic electronic signals in an exclusive OR circuit to produce an output periodic electronic signal at twice said first frequency.

10. The method of claim 9 wherein said output periodic electronic signal is characterized as having single cycle periodicity.

11. The method of claim 9 wherein said output periodic electronic signal is characterized as having a duty cycle of substantially 50 percent.

12. The method of claim 9 wherein said first periodic electronic signal is characterized as having a duty cycle of less than 47 percent or more than 53 percent.

13. The method of claim 9 wherein said circuitry configured to average comprises circuitry configured to pass one signal through an inverting delay circuit and the other signal through a non-inverting delay circuit.

14. The method of claim 13 wherein said inverting delay circuit and said non-inverting delay circuit are characterized as having about the same delay time.

15. The method of claim 9 further comprising circuitry configured to condition said first, second, third and fourth periodic electronic signals for proper function in digital circuitry prior to access by said circuitry configured to average.

16. The method of claim 9 further comprising:
circuitry configured to average said first and said second periodic electronic signals to produce a third averaged periodic electronic signal;
circuitry configured to average said third and said fourth periodic electronic signals to produce a fourth averaged periodic electronic signal;
circuitry configured to combine said third and said fourth averaged periodic electronic signals in an exclusive OR circuit to produce a second output periodic electronic signal at twice said first frequency; and
circuitry configured to average said output periodic electronic signal and said second output periodic electronic signal to produce a new output periodic electronic signal characterized as having a duty cycle of substantially 50 percent.

* * * * *

UNITED STATES PATENT AND TRADEMARK OFFICE
CERTIFICATE OF CORRECTION

PATENT NO. : 8,508,262 B2
APPLICATION NO. : 13/227166
DATED : August 13, 2013
INVENTOR(S) : William N. Schnaitter et al.

It is certified that error appears in the above-identified patent and that said Letters Patent is hereby corrected as shown below:

In the Drawings

Delete Drawing Sheet 11 of 12 and substitute therefore with the attached Drawing Sheet 11 of 12 consisting of replacement FIG. 10.

Signed and Sealed this
Third Day of June, 2014

Michelle K. Lee
*Deputy Director of the United States Patent and Trademark Office*